United States Patent
Chen et al.

(10) Patent No.: US 9,659,620 B2
(45) Date of Patent: May 23, 2017

(54) MEMORY DEVICE WITH SELF-BOOSTED MECHANISM

(71) Applicant: TAIWAN SEMICONDUCTOR MANUFACTURING CO., LTD., Hsinchu (TW)

(72) Inventors: Yen-Huei Chen, Jhudong Township (TW); Hung-Jen Liao, Hsin-Chu (TW); Chih-Yu Lin, Taichung (TW); Jonathan Tsung-Yung Chang, Hsinchu (TW); Wei-Cheng Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/670,241

(22) Filed: Mar. 26, 2015

(65) Prior Publication Data

US 2016/0284387 A1    Sep. 29, 2016

(51) Int. Cl.
| | |
|---|---|
| G11C 11/34 | (2006.01) |
| G11C 7/00 | (2006.01) |
| G11C 8/00 | (2006.01) |
| G11C 8/08 | (2006.01) |
| G11C 11/418 | (2006.01) |

(52) U.S. Cl.
CPC .............. *G11C 8/08* (2013.01); *G11C 11/418* (2013.01)

(58) Field of Classification Search
USPC .......................... 365/185.23, 189.11, 230.06
See application file for complete search history.

(56) References Cited

U.S. PATENT DOCUMENTS

| | | | | |
|---|---|---|---|---|
| 4,901,280 | A | * | 2/1990 | Patel .................... G11C 11/4085 365/189.11 |
| 5,202,851 | A | * | 4/1993 | Do .......................... G11C 8/10 365/189.11 |
| 5,633,832 | A | * | 5/1997 | Patel ........................ G11C 8/08 365/189.11 |
| 6,535,424 | B2 | | 3/2003 | Le et al. |
| 8,705,297 | B2 | | 4/2014 | Kim et al. |

* cited by examiner

*Primary Examiner* — Trong Phan
(74) *Attorney, Agent, or Firm* — Maschoff Brennan (57) ABSTRACT

An electronic device is disclosed that includes memory cells, a word line, a selection unit and a self-boosted driver. The memory cells are configured to store data. The word line is coupled to the memory cells. The selection unit is disposed at a first terminal of the word line, and is configured to transmit a selection signal to activate the word line according to one of a read command and a write command. The self-boosted driver is disposed at a second terminal of the word line, and is configured to pull up a voltage level of the word line according to a voltage level of the word line and a control signal.

20 Claims, 6 Drawing Sheets

MEMORY DEVICE WITH SELF-BOOSTED MECHANISM

BACKGROUND

Recently, memory devices have been widely applied in various kinds of electronic products, such as computer, mobile phones, tablets, and so on. In order to provide more data capacity, a boosted word line circuit was developed. With the boosted word line circuit, a driving ability of the memory device is improved, and thus both of the data capacity and performance of the memory device can be increased.

BRIEF SUMMARY OF THE DISCLOSURE

According to an aspect of some embodiments, an electronic device may include memory cells, a word line, a selection unit, and a self-boosted driver. The memory cells are configured to store data. The word line is coupled to the memory cells. The selection unit is disposed at a first terminal of the word line and is configured to transmit a selection signal to activate the word line according to one of a read command and a write command. The self-boosted driver is disposed at a second terminal of the word line and is configured to pull up a voltage level of the word line according to the voltage level of the word line and a control signal.

The object and advantages of the embodiments will be realized and achieved at least by the elements, features, and combinations particularly pointed out in the claims.

It is to be understood that both the foregoing general description and the following detailed description are merely examples and explanatory and are not restrictive of the invention, as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

In this document, the term "coupled" may also be termed as "electrically coupled," and the term "connected" may be termed as "electrically connected". "Coupled" and "connected" may also be used to indicate that two or more elements cooperate or interact with each other.

Figure 1A:
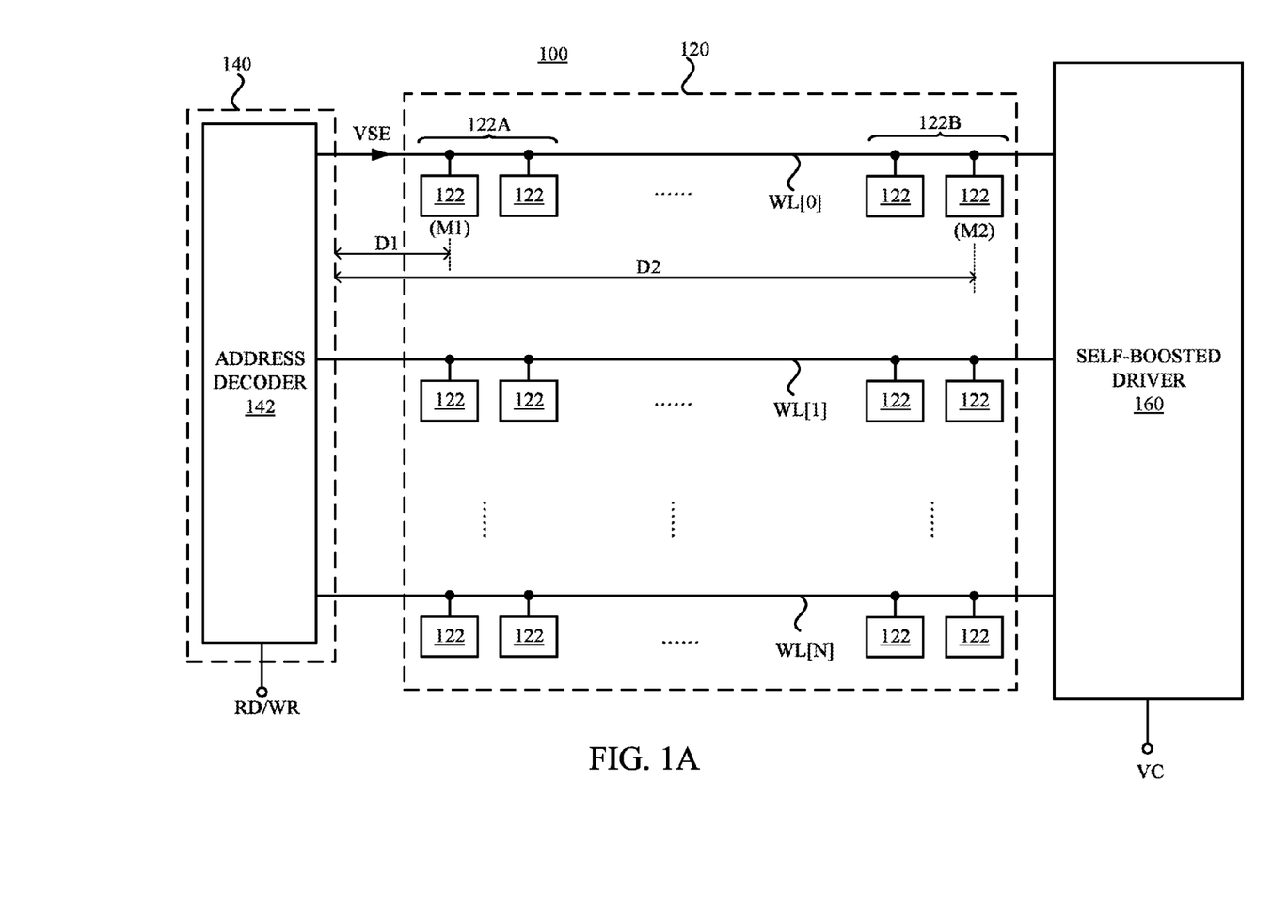
FIG. 1A is a schematic diagram of an electronic device, in accordance with various embodiments of the present disclosure.

FIG. 1A is a schematic diagram of an electronic device 100, in accordance with various embodiments of the present disclosure.

As illustratively shown in FIG. 1A, the electronic device 100 includes a memory array 120, a selection unit 140, and a self-boosted driver 160. The memory array 120 includes word lines WL[0]-WL[N] and memory cells 122. The memory cells 122 are configured to store data. A portion of the memory cells 122 is coupled to a corresponding one of the word lines WL[0]-WL[N]. In some embodiments, the memory cells 122 are implemented with a bit cell of a static random access memory (SRAM) device. For example, the memory cell 122 is a six transistors (6T) cell. Such an example is only given for illustrative purposes, and various types of the memory cells 122 able to perform the same function are able to be applied to the electronic device 100. Therefore, the present disclosure is not limited to the given example, and various types of the memory cells 122 are within the contemplated scope of the present disclosure.

The selection unit 140 is disposed at first terminals of the word lines WL[0]-WL[N], and is coupled to first terminals of the word lines WL[0]-WL[N]. The selection unit 140 is configured to select one of the word lines WL[0]-WL[N] according to one of a read command RD and a write command WR. In some embodiments, the selection unit 140 includes an address decoder 142. The address decoder 142 is configured to generate a selection signal VSE to activate a corresponding one of the word lines WL[0]-WL[N] according to the read command RD or the write command WR, so as to read the data stored in the memory cells 122, or to write the data into the memory cells 122.

The self-boosted driver 160 is disposed at second terminals of the word lines WL[0]-WL[N], and is coupled to second terminals of the word lines WL[0]-WL[N]. The self-boosted driver 160 is configured to pull up a voltage level of the selected one of the word lines WL[0]-WL[N] according to the voltage level on the selected one of the word lines WL[0]-WL[N] and a control signal VC. As a result, a driving ability of the selected one of the word lines WL[0]-WL[N] is improved by the self-boosted driver 160. Detailed operations related to the self-boosted driver 160 will be described in the following paragraphs.

Figure 1B:
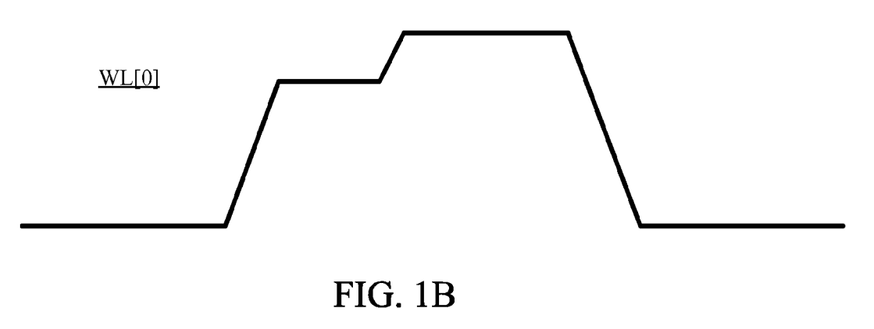
FIG. 1B is a waveform illustrating the voltage level at the first terminal of the selected word line of the electronic device without the self-boosted driver in FIG. 1 in other approaches.
Figure 1C:
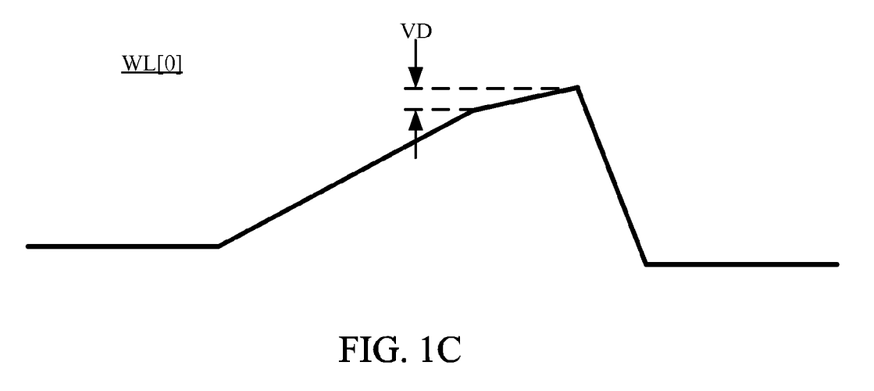
FIG. 1C is a waveform illustrating the voltage level at the second terminal of the selected word line of the electronic device without the self-boosted driver in FIG. 1 in other approaches.

Reference is now made to FIG. 1A, FIG. 1B, and FIG. 1C, for illustration with the word line WL[0] being selected. FIG. 1B is a waveform illustrating the voltage level at the first terminal of the selected word line WL[0] of the electronic device 100 without the self-boosted driver 160 in FIG. 1A, in other approaches. FIG. 1C is a waveform illustrating the voltage level at the second terminal of the selected word line WL[0] of the electronic device 100 without the self-boosted driver 160 in FIG. 1A, in other approaches.

For illustration in FIG. 1A, a distance between the selection unit 140 and the memory cells 122 placed nearby the first terminals of the word lines WL[0]-WL[N] is much less than a distance between the selection unit 140 and the memory cells 122 placed nearby the second terminals of the word lines WL[0]-WL[N]. For illustration, as shown in FIG. 1A, a distance D1 between the selection unit 140 and the memory cell M1 is less than a distance D2 between the selection unit 140 and the memory cell M2. Therefore, in view of the selection unit 140, in the present disclosure, the memory cells 122 placed nearby the first terminals of the word lines WL[0]-WL[N] are referred to as "near-end memory cells 122A" hereinafter. Similarly, in view of the selection unit 140, in the present disclosure, the memory cells 122 placed nearby the second terminals of the word lines WL[0]-WL[N] are referred to as "far-end memory cells 122B" hereinafter.

Further, as illustratively shown in FIG. 1B, when the word line WL[0] is selected, the address decoder 142 outputs the selection signal VSE to the first terminal of the word line WL[0], and the word line WL[0] is thus activated. In other words, the voltage level of the word line WL[0] is pulled up to turn on the memory cells 122 coupled to the word line WL[0]. However, in some embodiments, when the number of the memory cells 122 increases, the length of the word line WL[0] is required to be increased to accommodate the memory cells 122. As a result, an equivalent resistance of the word line WL[0] increases. Thus, as illustratively shown in FIG. 1C, a voltage drop VD is presented in the selection signal VSE received at the second terminal of the selected word line WL[0], and thus a slew rate of a variation in the voltage level of the selected word line WL[0] is reduced. In other words, the selection signal VSE cannot be correctly transmitted from the first terminal of the word line WL[0] to the second terminal of the word line WL[0]. Consequently, the near-end memory cells 122A coupled to the selected word line WL[0] are fully turned on, but the far-end memory cells 122B coupled to the selected word line WL[0] cannot be correctly turned on or just are slightly turned on. As a result, the read operation or the write operation on the electronic device 100 fails.

Explained in a different way, the voltage level of the selected word line WL[0] is pulled by the selection signal VSE, and the selection signal VSE is transmitted from the first terminal of the selected word line WL[0] to the second terminal of the selected word line WL[0]. Thus, the selection signal VSE received at the second terminal of the word line WL[0] is distorted due to the high resistance of the selected word line WL[0], and a signal integrity of the selection signal VSE received at the second terminal of the selected word line WL[0] is reduced. As a result, as illustratively shown in FIG. 1C, the slew rate and the voltage level of the second terminal of the word line WL[0] is decreased, and thus the driving ability of the selected word line WL[0] is insufficient to turn on the far-end memory cells 122B coupled to the word line WL[0].

Compared to the approaches discussed above with reference to FIG. 1B and FIG. 1C, whenever the selected word line WL[0] is activated by the selection signal VSE, the self-boosted driver 160 illustrated in the embodiments with reference to FIG. 1A, is employed to pull up the voltage level of the selected word line WL[0]. Effectively, the voltage level at the second terminal of the word line WL[0] is pulled up without additional address control mechanism. As a result, not only the near-end memory cells 122A but also the far-end memory cells 122B can be correctly turned on, and performance and operational reliability of the electronic device 100 are thus improved.

The numbers of the word lines WL[0]-WL[N], and the memory cells 122 in FIG. 1A are given for illustrative purposes. Various numbers of the word lines WL[0]-WL[N] and the memory cells 122 are within the contemplated scope of the present disclosure.

The following paragraphs provide various embodiments related to the electronic device 100 to illustrate functions and applications thereof. The present disclosure is not limited to the following embodiments. Other embodiments are within the contemplated scope of the present disclosure.

Figure 2:
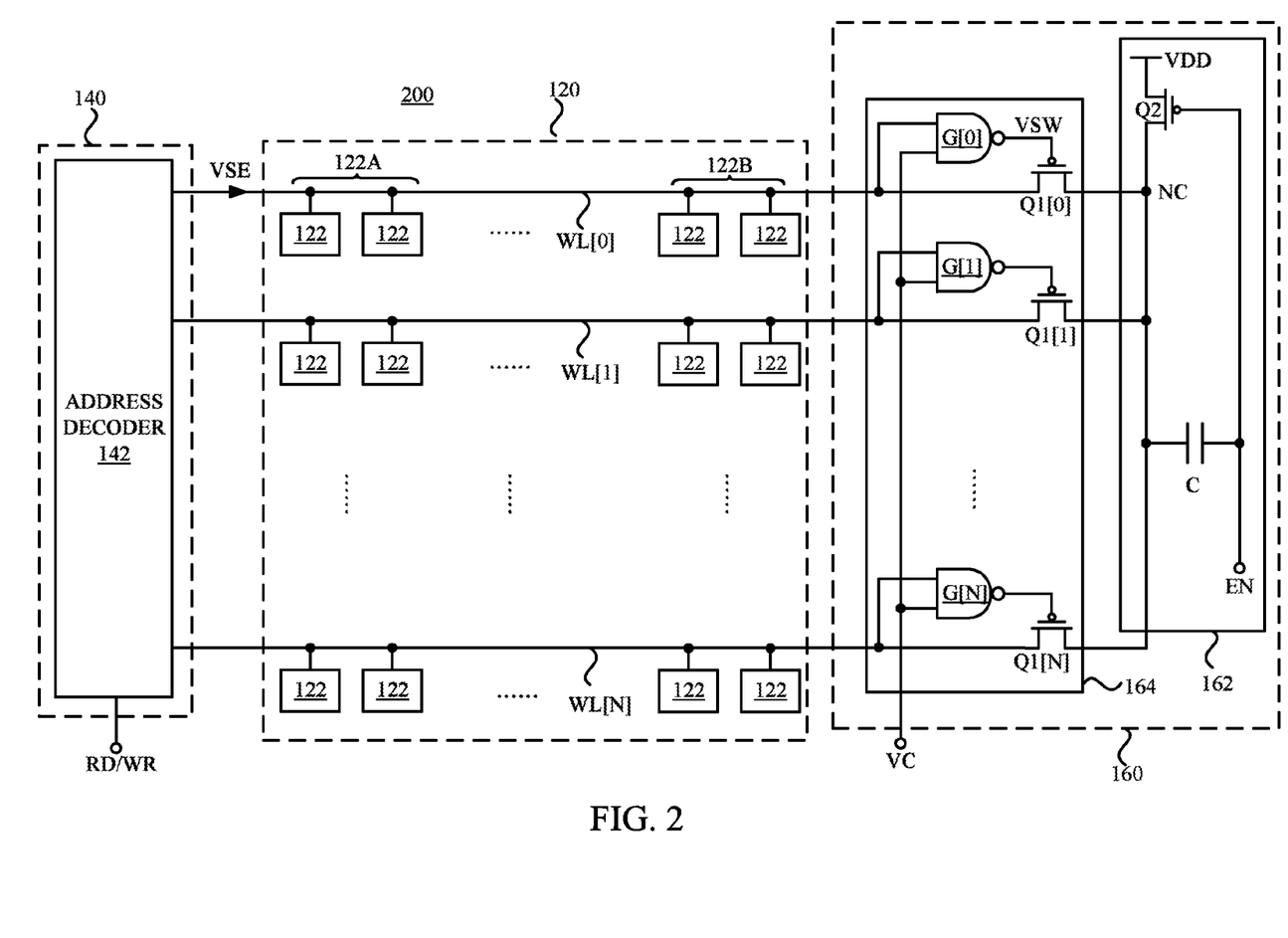
FIG. 2 is a schematic diagram of an electronic device in accordance with various embodiments of the present disclosure.

Reference is now made to FIG. 2. FIG. 2 is a schematic diagram of an electronic device 200, in accordance with various embodiments of the present disclosure.

As illustratively shown in FIG. 2, compared with the electronic device 100 shown in FIG. 1A, in this embodiment, the self-boosted driver 160 of the electronic device 200 includes a voltage generating circuit 162 and a self-selected circuit 164.

The voltage generating circuit 162 is coupled to the self-selected circuit 164. The voltage generating circuit 162 is configured to transmit a voltage VDD to the self-selected circuit 164 according to an enable signal EN. The self-selected circuit 164 is coupled to the second terminals of the word lines WL[0]-WL[N]. The self-selected circuit 164 is configured to pull up the voltage level of the selected one of the word lines WL[0]-WL[N] to the voltage VDD.

As shown in FIG. 2, the self-selected circuit 164 includes NAND gates G[0]-G[N] and switches Q1[0]-Q1[N]. One of the NAND gates G[0]-G[N] and one of the switches Q1[0]-Q1[N] are coupled to a corresponding one of the word lines WL[0]-WL[N]. For simplicity, an arrangement of the NAND gate G[0] and switch Q1[0] and operations thereof are described in the following paragraphs. Arrangements and operations of the rest NAND gates G[1]-G[N] and switches Q1[1]-Q1[N] can be deduced by analogy, and thus they are not further detailed herein.

In greater detail, a first input terminal of the NAND gate G[0] is coupled to the word line WL[0], a second input terminal of the NAND gate G[0] is configured to receive the control signal VC, and an output terminal of the NAND gate G[0] is coupled to a control terminal of the switch Q1[0]. The NAND gate G[0] is configured to generate a switching signal VSW according to the voltage level of the word line WL[0], i.e., the selection signal VSE received at the second terminal of the word line WL[0], and the control signal VC. A first terminal of the switch Q1[0] is coupled to the second terminal of the word line WL[0], and a second terminal of the switch Q1[0] is coupled to the voltage generating circuit 162 at a control node NC. The switch Q1[0] is configured to be selectively turned on to connect the control node NC to the word line WL[0] according to the switching signal VSW, so that the voltage level of the selected word line WL[0] is pulled up to a voltage level of the control node NC.

Further, the voltage generating circuit 162 includes a switch Q2 and a capacitor C. A first terminal of the switch Q2 is configured to receive the voltage VDD, a second terminal of the switch Q2 is coupled to the second terminal of the switch Q1[0] at the control node NC, and a control terminal of the switch Q2 is configured to receive the enable signal EN. The switch Q2 is configured to be selectively turned on to transmit the voltage VDD to the control node NC according to the enable node EN. A first terminal of the capacitor C is coupled to the control terminal of the switch Q2, and is configured to receive the enable signal EN. A second terminal of the capacitor C is coupled to the second terminal of the switch Q1[0] at the control node NC. The capacitor C is configured to pull up the voltage level of the control node NC to a voltage BVDD (not shown in FIG. 2) according to the enable signal EN, in which the voltage BVDD is higher than the voltage VDD.

The arrangement of the self-boosted driver 160 in FIG. 2 is given for illustrative purposes. Various arrangements of the self-boosted driver 160 are within the contemplated scope of the present disclosure.

Figure 3:
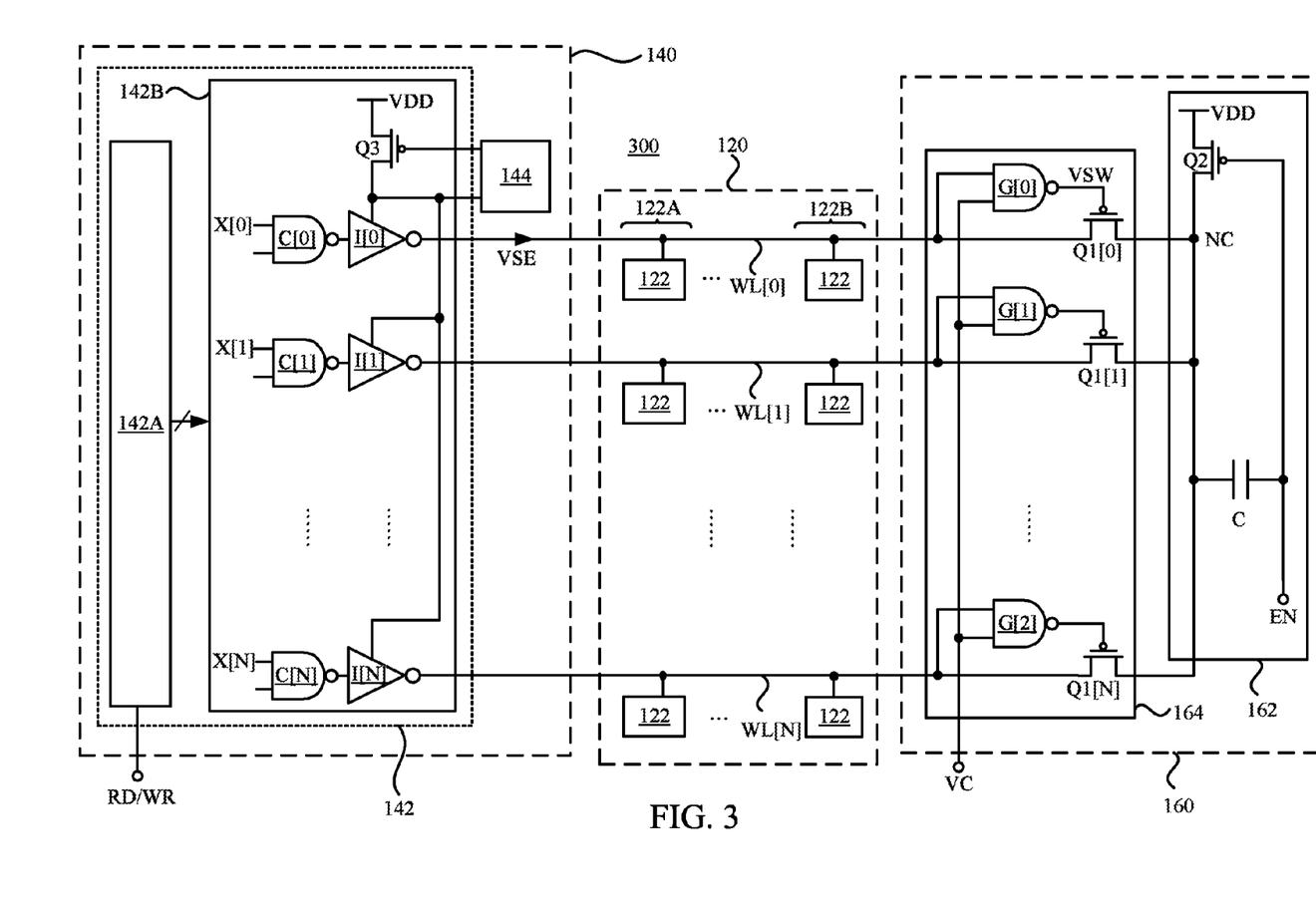
FIG. 3 is a schematic diagram of an electronic device, in accordance with various embodiments of the present disclosure.

Reference is now made to FIG. 3. FIG. 3 is a schematic diagram of an electronic device 300, in accordance with various embodiments of the present disclosure.

As illustratively shown in FIG. 3, compared with the electronic device 200 shown in FIG. 2, the selection unit 140 of the electronic device 300 further includes a boosted word line circuit 144. The boosted word line circuit 144 is coupled to the address decoder 142. The boosted word line circuit 144 is configured to pull up the selection signal VSE to the voltage BVDD during a period that one of the word lines WL[0]-WL[N] is activated. For illustration, the boosted word line circuit 144 controls the switch Q3 to pull up a driving voltage of the address decoder 142, so as to pull up the selection signal VSE through the address decoder 142. In some embodiments, when the number of the memory cells 122 is increased, the boosted word line circuit 144 is utilized for boosting the voltage level of the selection signal VSE. As a result, the driving ability of the selected one of the word lines WL[0]-WL[N] is increased. Effectively, the performance of the near-end memory cells 122A coupled to the selected one of the word lines WL[0]-WL[N] is improved.

In some embodiments, the address decoder 142 is implemented with digital circuits. In some other embodiments, the boosted word line circuit 144 is implemented with digital circuits. In various embodiments, the boosted word line circuit 144 is implemented with analog circuits or mixed signal circuits.

In addition, in some embodiments, the address decoder 142 includes a decoder circuit 142A and a control circuit 142B. The decoder circuit 142A is configured to decode one of the read command RD and the write command WR to generate control signals X[0], X[1], . . . , and X[N]. In further embodiments, the decoder circuit 142A is implemented with digital circuits. The control circuit 142B includes a switch Q3, inverters I[0]-I[N], and NAND gates C[0]-C[N]. A first terminal of the switch Q3 is configured to receive the voltage VDD, a second terminal of the switch Q3 is coupled to the boosted word line circuit 144, and a control terminal of the switch Q3 is coupled to the boosted word line circuit 144. The NAND gates C[0]-C[N] are configured to process the control signals X[0]-X[N] to control the inverters I[0]-I[N]. The inverters I[0]-I[N] are driven by both of the boosted word line circuit 144 and the NAND gates C[0]-C[N] to generate the selection signal VSE, so that one of the word lines WL[0]-WL[N] is selected. The switch Q3 is selectively turned on by the boosted word line circuit 144 to boost the driving voltage of the inverters I[0]-I[N], so as to pull up the voltage level of the selection signal VSE.

In some other embodiments, the electronic device 300 is able to operate without the boosted word line circuit 144. Alternatively stated, in some embodiments, the self-boosted driver 160 is able to independently improve the performance of the far-end memory cells 122B without utilizing the boosted word line circuit 144.

The arrangement of the address decoder 142 in FIG. 3 is given for illustrative purposes. Various arrangements of the address decoder 142 are able to be applied to the selection unit 140, and are within the contemplated scope of the present disclosure.

Figure 4:
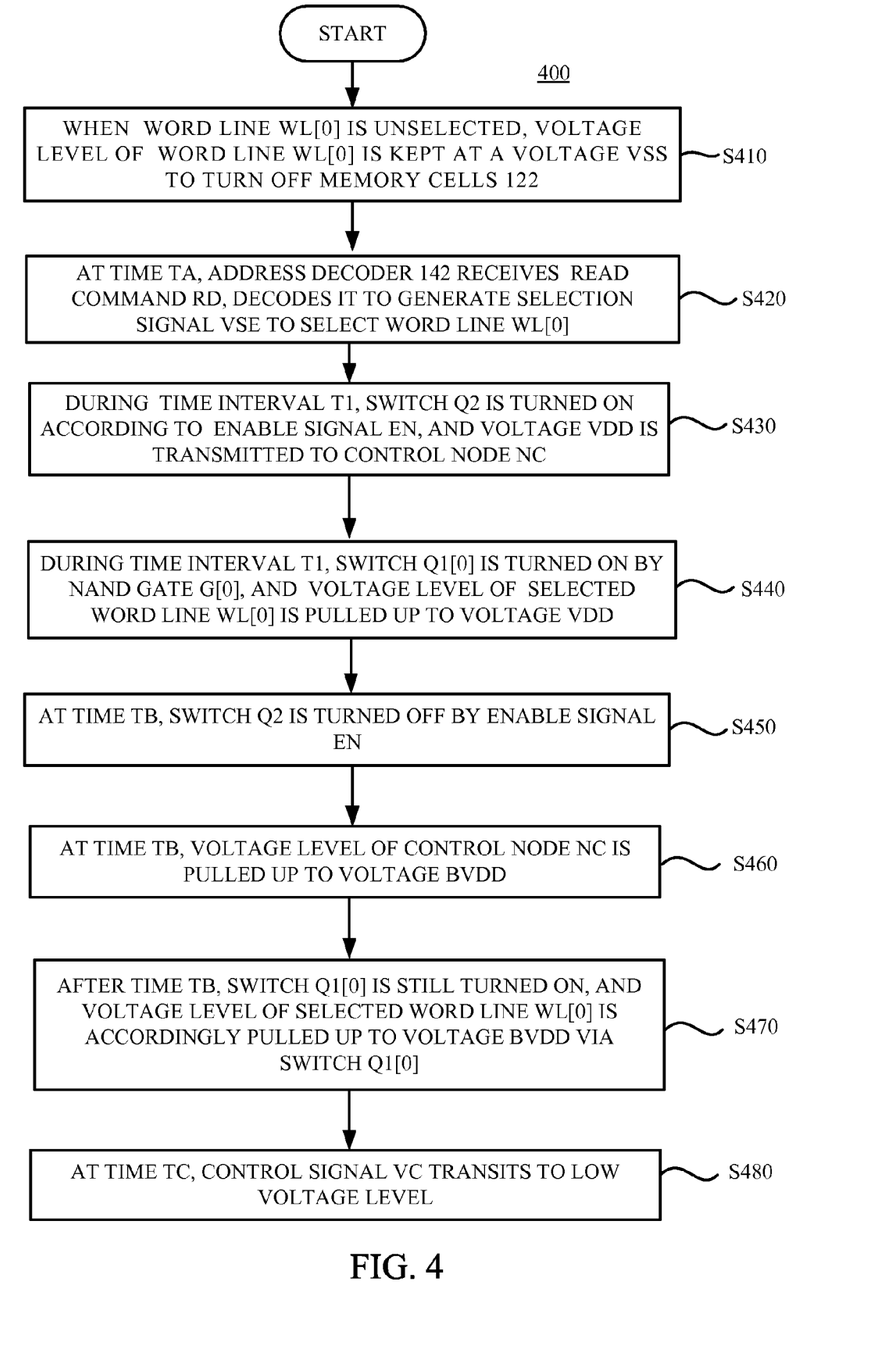
FIG. 4 is a flow chart of a driving method illustrating operations of the electronic device in FIG. 3, in accordance with various embodiments of the present disclosure.
Figure 5:
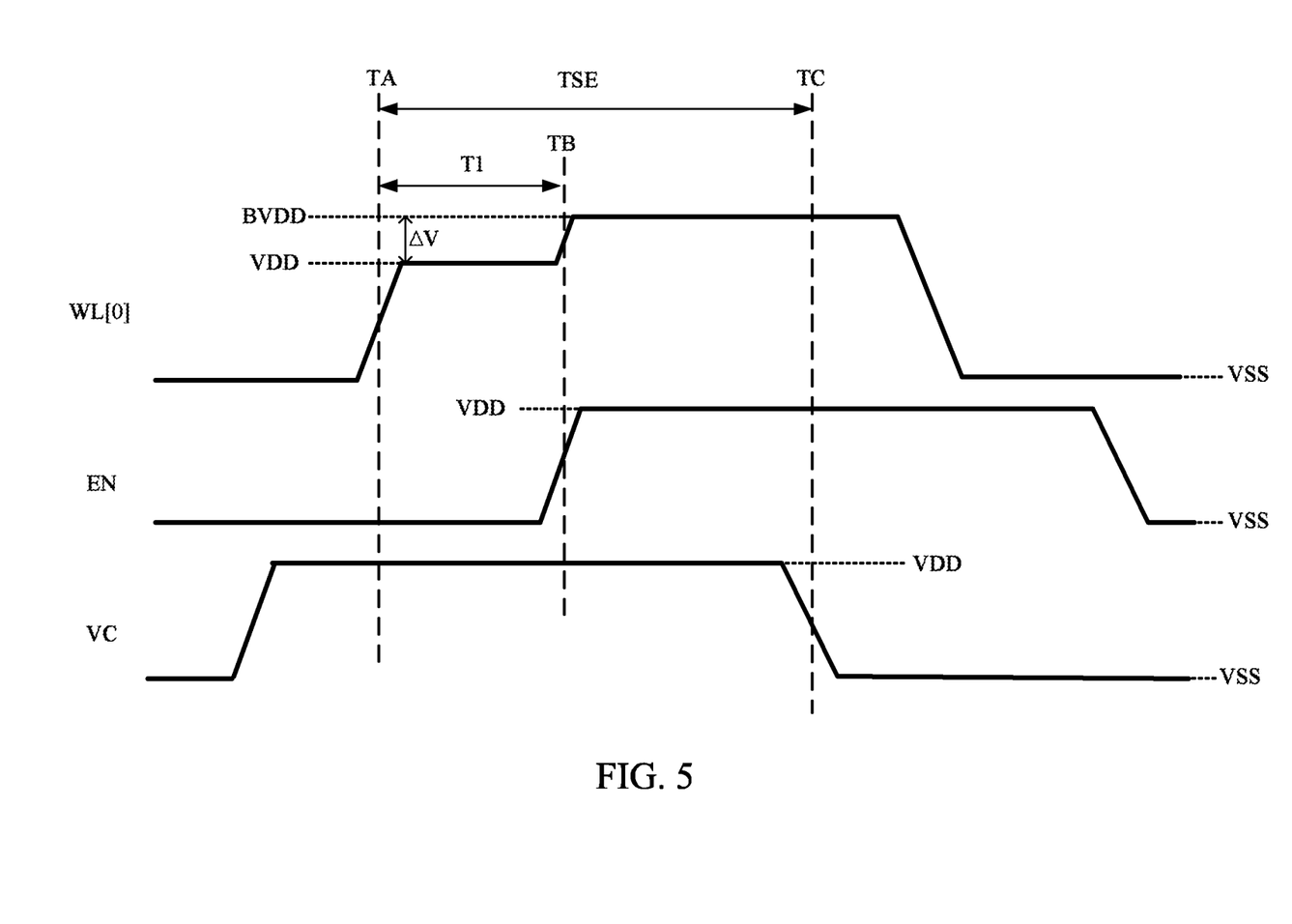
FIG. 5 is a graph illustrating operation waveforms of the voltage level at the second terminal of the word line, the enable signal, and the control signal in FIG. 3, in accordance with various embodiments of the present disclosure.

Reference is now made to FIG. 3, FIG. 4, and FIG. 5. FIG. 4 is a flow chart of a driving method 400 illustrating operations of the electronic device 300 in FIG. 3, in accordance with various embodiments of the present disclosure. FIG. 5 is a graph illustrating operation waveforms of the signal at the second terminal of the word line WL[0], the enable signal EN, and the control signal VC in FIG. 3, in accordance with various embodiments of the present disclosure. As an example, the operations of the electronic device 300 of FIG. 3 are described with reference to the driving method 400 and waveforms illustrated in FIG. 5. For simplicity, the word line WL[0] being selected according to the read command RD is given for illustration.

In operation S410, when the word line WL[0] is unselected, the voltage level of the word line WL[0] is kept at a voltage VSS to turn off the memory cells 122, in which the voltage VSS is lower than the voltage VDD. At the same time, the NAND gate G[0] outputs the switching signal VSW having a high logic value "1", and thus the switch Q1[0] is turned off.

In operation S420, at time TA, the address decoder 142 receives the read command RD, and decodes it to generate the selection signal VSE to select the word line WL[0]. In other words, the word line WL[0] is selected and activated during a time interval T1 within a time interval TSE, and the voltage level of the word line WL[0], i.e., the voltage level of the selection signal VSE, is thus pulled up to the voltage VDD.

In operation S430, during the time interval T1, the switch Q2 is turned on according to the enable signal EN, and the voltage VDD is transmitted to the control node NC. For example, during the time interval T1, the enable signal EN is at a low voltage level, i.e., the voltage VSS, and the voltage VDD is thus transmitted to the control node NC through the switch Q2.

In operation S440, during the time interval T1, the switch Q1[0] is turned on by the NAND gate G[0], and the voltage level of the selected word line WL[0] is pulled up to the voltage VDD.

For example, during the time interval T1, both of the control signal VC and the voltage level of the word line WL[0] are at a high voltage level, i.e., the voltage VDD, and the NAND gate G[0] accordingly outputs the switching signal VSW having a low logic value "0." As a result, the switch Q1[0] is turned on, and thus the voltage level of the word line WL[0] is pulled up to the voltage level of the control node NC, i.e., the voltage VDD.

In some embodiments, a rising edge of the control signal VC is configured to occur before the selected word line WL[0] is activated. In other words, the control signal VC is configured to enter its enabling period, i.e., the time interval of the control signal VC being at the high voltage level, when the address decoder 142 receives one of the read command RD and the write command WR. With such a configuration, whenever the voltage level of the selected word line WL[0] goes high, the NAND gate G[0] immediately outputs the switching signal VSW to turn on the switch Q1[0].

With continued reference to FIG. 3, FIG. 4, and FIG. 5, in operation S450, at time TB, the switch Q2 is turned off by the enable signal EN. For example, at time TB, i.e., a rising edge of the enable signal EN, the enable signal EN transits to a high voltage level, i.e. VDD, (the enable signal EN rises to high level at VDD instead of BVDD, the BVDD is generated by coupling the capacitor C from the rising edge of EN signal. The generated BVDD signal is at the control node NC, and the high level of the enable signal EN is VDD.) and enters its enabling period TE, and thus the switch Q2 is turned off.

In operation S460, at time TB, the voltage level of the control node NC is pulled up to the voltage BVDD. For example, the enable signal EN is coupled to the control node NC via the capacitor C. When the enable signal EN transits to the voltage VDD, the voltage level of the control node NC is increased from the voltage VDD to the voltage BVDD due to the capacitor C. It is noted that the voltage BVDD is expressed as: BVDD=VDD+ΔV, where ΔV is a voltage amount. With such a configuration, the driving ability of the selected word line WL[0] can be further increased, and thus the far-end memory cells 122B coupled to the selected word line WL[0] can be fully turned on. A person of ordinary skill in the art is able to set the voltage amount ΔV by setting the voltage level of the enable signal EN depending on requirements of actual applications.

In some embodiments, a timing of the rising edge of the enable signal EN, i.e., time TB, is configured to be within the time interval of the selected word line WL[0] being activated, i.e., the time interval TSE. In some other embodiments, the time interval of the enable signal EN being at the voltage VDD during the selected word line WL[0], i.e., the time interval TSE, is activated is about one-thirds to about two-thirds of the time interval TSE. With such a configuration, the voltage level of the selected word line WL[0] can be ensured to be correctly pulled up to the voltage BVDD, and thus the selected word line WL[0] is able to correctly turn on the far-end memory cells 122B coupled to the selected word line WL[0].

In some embodiments, the timing of the rising edge of the enable signal EN is configured to be about the same as a timing for the selection signal VSE being pulled up to the voltage BVDD by the boosted word line circuit 144. With such a configuration, all of the memory cells 122 coupled to the selected word line WL[0] is turned on at about the same time, and thus the operational efficiency of the electronic device 300 is improved.

With continued reference to FIG. 3, FIG. 4, and FIG. 5, in operation S470, after the time TB, the switch Q1[0] is still turned on, and the voltage level of the selected word line WL[0] is accordingly pulled up to the voltage BVDD via the switch Q1[0]. As a result, the voltage level of the selected word line WL[0] is self-boosted without additional address control mechanism, and an area penalty and the driving ability of the electronic device 300 is improved accordingly.

In operation S480, at time TC, which is the time at the end of the time interval TSE, the control signal VC transits to the low voltage level, i.e., the voltage VSS.

In some embodiments, a falling edge of the control signal VC occurs before the word line WL[0] is deactivated by the address decoder 141. For illustration, the falling edge of the control signal VC occurs when the selection signal VSE transits to the low voltage level. With such a configuration, the switch Q1[0] is turned off in advance. As a result, the slew rate of the voltage level of the word line WL[0] transiting from the voltage BVDD to the voltage VSS is accelerated. Accordingly, the operational efficiency of the electronic device 300 is further improved.

In summary, the electronic device of the present disclosure is able to pull up the voltage level of the selected word line without additional address control mechanisms, and the driving ability of the selected word line is improved. As a result, costs and area penalty of the electronic device can be reduced, and the performance of the electronic device can be improved.

In some embodiments, an electronic device is disclosed that includes memory cells, a word line, a selection unit and a self-boosted driver. The memory cells are configured to store data. The word line is coupled to the memory cells. The selection unit is disposed at a first terminal of the word line, and is configured to transmit a selection signal to activate the word line according to one of a read command and a write command. The self-boosted driver is disposed at a second terminal of the word line, and is configured to pull up a voltage level of the word line according to a voltage level of the word line and a control signal.

Also disclosed is an electronic device that includes a word line, memory cells, an address decoder, and a self-selected circuit. The memory cells coupled to the word line. The address decoder is disposed at and coupled to a first terminal of the word line. The self-selected circuit is disposed at and coupled to a second terminal of the word line, and is configured to pull up a voltage level of the word line to a first voltage according to a voltage level of the word line and a control signal.

Also disclosed is a driving method that includes the operations below. A selection signal is generated by an address decoder disposed at a first terminal of the word line to select a word line according to one of a read command and a write command. A voltage level of the word line is pulled up to a first voltage by a self-selected circuit disposed at a second terminal of the word line according to a voltage level of the word line and a control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   a plurality of memory cells configured to store data;
   a word line coupled to the memory cells;
   a selection unit disposed at a first terminal of the word line, the selection unit configured to transmit a selection signal to activate the word line according to one of a read command and a write command; and
   a self-boosted driver disposed at a second terminal of the word line, the self-boosted driver comprising:
      a voltage generating circuit configured to transmit a first voltage to a control node according to an enable signal; and
      a self-selected circuit configured to pull up a voltage level of the word line to the voltage level of the control node according to the voltage level of the word line and a control signal.

2. The electronic device of claim 1, wherein the self-selected circuit comprises:
   a NAND gate configured to generate a switching signal according to the voltage level of the word line and the control signal; and
   a first switch configured to be selectively turned on to couple the control node to the word line according to the switching signal.

3. The electronic device of claim 2, wherein the voltage generating circuit comprises:
   a second switch configured to be selectively turned on to transmit the first voltage to the control node according to the enable signal; and
   a capacitor configured to pull up the voltage level of the control node to a second voltage according to the enable signal, wherein the second voltage is higher than the first voltage.

4. The electronic device of claim 3, wherein a rising edge of the enable signal is configured to occur within a time interval of the word line being activated by the selection unit.

5. The electronic device of claim 4, wherein a time interval of the enable signal being at the first voltage during the word line is activated is about one-thirds to about two-thirds of the time interval of the word line being activated.

6. The electronic device of claim 3, wherein the selection unit further comprises:
   an address decoder configured to generate the selection signal to the word line according to one of the read command and the write command.

7. The electronic device of claim 6, wherein the selection unit further comprises:
   a boosted word line circuit configured to pull up the selection signal to the second voltage,
   wherein a timing of a rising edge of the enable signal is configured to be about the same as a timing for the selection signal being pulled up to the second voltage.

8. The electronic device of claim 1, wherein a falling edge of the control signal is configured to occur before the word line is deactivated.

9. The electronic device of claim 1, wherein a rising edge of the control signal is configured to occur before the word line is activated by the selection unit.

10. An electronic device, comprising:
    a word line;
    a plurality of memory cells coupled to the word line;
    an address decoder disposed at and coupled to a first terminal of the word line; and
    a self-selected circuit disposed at and coupled to a second terminal of the word line, the self-selected circuit configured to receive a control signal and configured to pull up a voltage level of the word line to a first voltage in response to the control signal and the voltage level of the word line,
    wherein the first voltage is transmitted to the self-selected circuit according to an enable signal, and a rising edge of the enable signal is configured to occur within a time interval of the word line being activated by the address decoder.

11. The electronic device of claim 10, wherein the self-selected circuit comprises:
    a NAND gate, wherein a first input terminal of the NAND gate is coupled to the word line, and a second input terminal of the NAND gate is configured to receive the control signal; and
    a first switch, wherein a first terminal of the first switch is coupled to the word line, a second terminal of the first switch is configured to receive the first voltage, and a control terminal of the first switch is coupled to an output terminal of the NAND gate.

12. The electronic device of claim 11, further comprising:
    a second switch, wherein a first terminal of the second switch is configured to receive the first voltage, a second terminal of the second switch is coupled to the second terminal of the first switch, and a control terminal of the second switch is configured to receive the enable signal; and
    a capacitor, wherein a first terminal of the capacitor is configured to receive the enable signal, and a second terminal of the capacitor is coupled to the second terminal of the first switch.

13. The electronic device of claim 12, wherein the address decoder is configured to generate a selection signal to activate the word line, and electronic device further comprises:
    a boosted word line circuit coupled to the address decoder, and being configured to pull up a voltage level of the selection signal to a second voltage during the word line is activated,
    wherein the second voltage is higher than the first voltage, and a timing of the rising edge of the enable signal is configured to be about the same as a timing for the selection signal being pulled up to the second voltage.

14. The electronic device of claim 10, wherein a falling edge of the control signal is configured to occur before the word line is deactivated.

15. The electronic device of claim 10, wherein a rising edge of the control signal is configured to occur before the word line is activated by the address decoder.

16. A driving method, comprising
    generating a selection signal, by an address decoder disposed at a first terminal of a word line, to select the word line according to one of a read command and a write command;
    transmitting, by a voltage generating circuit disposed at a second terminal of the word line, a first voltage to a control node according to an enable signal; and pulling up a voltage level of the word line, by a self-selected circuit disposed at a second terminal of the word line, to the voltage level of the control node in response to a control signal and the voltage level of the word line.

17. The driving method of claim 16, wherein pulling up the voltage level comprises:
   generating a switching signal, by a NAND gate of the self-selected circuit, according to the voltage level of the word line and the control signal; and
   turning on a first switch of the self-selected circuit to transmit the first voltage from the control node to the word line according to the switching signal.

18. The driving method of claim 16, wherein transmitting the first voltage comprises:
   turning on a second switch of the voltage generating circuit to transmit the first voltage to the control node according to the enable signal; and
   pulling up the word line to a second voltage, by a capacitor of the voltage generating circuit, according to the enable signal,
   wherein the second voltage is higher than the first voltage, and a rising edge of the enable signal is configured to occur within a time interval of the word line being activated by the address decoder.

19. The driving method of claim 18, further comprising:
   setting a timing of the rising edge of the enable signal to be about the same as a timing for the selection signal being pulled up to the second voltage by a boosted word line circuit.

20. The driving method of claim 16, wherein a rising edge of the control signal is configured to occur before the word line is activated by the address decoder.

* * * * *